US012609508B2

(12) United States Patent
Weichmann et al.

(10) Patent No.: US 12,609,508 B2
(45) Date of Patent: Apr. 21, 2026

(54) VCSEL WITH INCREASED WAVELENGTH DEPENDENCE ON DRIVING CURRENT

(71) Applicant: TRUMPF Photonic Components GmbH, Ulm (DE)

(72) Inventors: Ulrich Weichmann, Aachen (DE); Holger Joachim Moench, Vaals (NL)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 799 days.

(21) Appl. No.: 17/952,342

(22) Filed: Sep. 26, 2022

(65) Prior Publication Data

US 2023/0020718 A1      Jan. 19, 2023

Related U.S. Application Data

(63) Continuation of application No. PCT/EP2021/058457, filed on Mar. 31, 2021.

(30) Foreign Application Priority Data

Mar. 31, 2020    (EP) .................................... 20167125

(51) Int. Cl.
*H01S 5/06* (2006.01)
*H01S 5/024* (2006.01)
(Continued)

(52) U.S. Cl.
CPC ........ *H01S 5/0262* (2013.01); *H01S 5/02461* (2013.01); *H01S 5/042* (2013.01);
(Continued)

(58) Field of Classification Search
CPC ..... H01S 5/183–18397; H01S 5/02461; H01S 5/0622; H01S 5/0601; H01S 5/2022
See application file for complete search history.

(56) References Cited

U.S. PATENT DOCUMENTS 4,573,156 A * 2/1986 Anthony ................... H01S 5/14
                                                        359/360
5,577,064 A * 11/1996 Swirhun ............... H01S 5/0424
                                                        257/85
(Continued)

FOREIGN PATENT DOCUMENTS

CN          110892596 A        3/2020
JP          2005252111 A       9/2005

OTHER PUBLICATIONS

Xuefei Tang et al.: "Observation of Bistability in GaAs Quantum-Well Vertical-Cavity Surface-Emitting Lasers," IEEE Journal of Quantum Electronics, vol. 33, No. 6, pp. 927-932, Jun. 1, 1997 (Jun. 1, 1997), Institute of Electrical and Electronics Engineers, Piscataway, NJ, USA.

*Primary Examiner* — Tod T Van Roy
(74) *Attorney, Agent, or Firm* — LEYDIG, VOIT & MAYER, LTD.

(57)                ABSTRACT

A Vertical Cavity Surface Emitting Laser (VCSEL) includes an optical resonator with a first reflector, a second reflector, and an active region for laser emission arranged between the first reflector and the second reflector, and an electrical contact arrangement configured to provide an electrical drive current to electrically pump the optical resonator. The optical resonator further comprises a loss layer introducing optical and electrical losses to increase wavelength shift of the laser emission when varying the drive current. The optical losses introduced by the loss layer are higher than the sum of the optical losses in remaining regions outside the active region. The electrical losses introduced by the loss layer are higher by a factor of at least 5 than the electrical losses in the remaining regions.

14 Claims, 8 Drawing Sheets

(51) Int. Cl.

| | | |
|---|---|---|
| *H01S 5/026* | (2006.01) | |
| *H01S 5/042* | (2006.01) | |
| *H01S 5/062* | (2006.01) | |
| *H01S 5/183* | (2006.01) | |
| *H01S 5/20* | (2006.01) | |

(52) U.S. Cl.

CPC .......... *H01S 5/0601* (2013.01); *H01S 5/0622* (2013.01); *H01S 5/18313* (2013.01); *H01S 5/18347* (2013.01); *H01S 5/0264* (2013.01); *H01S 5/2022* (2013.01)

(56)  References Cited

U.S. PATENT DOCUMENTS

| | | | | |
|---|---|---|---|---|
| 5,745,515 | A | 4/1998 | Marta et al. | |
| 8,451,706 | B2 * | 5/2013 | Kondo | G02B 6/4206 369/13.01 |
| 11,411,374 | B2 | 8/2022 | Weichmann | |
| 2007/0041414 | A1 | 2/2007 | Albrecht et al. | |
| 2009/0168819 | A1 | 7/2009 | Otoma | |
| 2011/0064110 | A1 | 3/2011 | Gerlach et al. | |
| 2011/0170568 | A1 * | 7/2011 | Kondo | H01S 5/1025 372/45.01 |
| 2014/0023380 | A1 * | 1/2014 | Takeda | H01S 5/18358 372/45.01 |
| 2016/0064899 | A1 * | 3/2016 | Hayakawa | H01S 5/18311 372/46.013 |
| 2018/0226768 | A1 * | 8/2018 | Brenner | H01S 5/18313 |
| 2019/0075402 | A1 | 3/2019 | Fishman et al. | |
| 2019/0173263 | A1 * | 6/2019 | Hamaguchi | H01S 5/187 |
| 2023/0020718 | A1 * | 1/2023 | Weichmann | H01S 5/02461 |

* cited by examiner

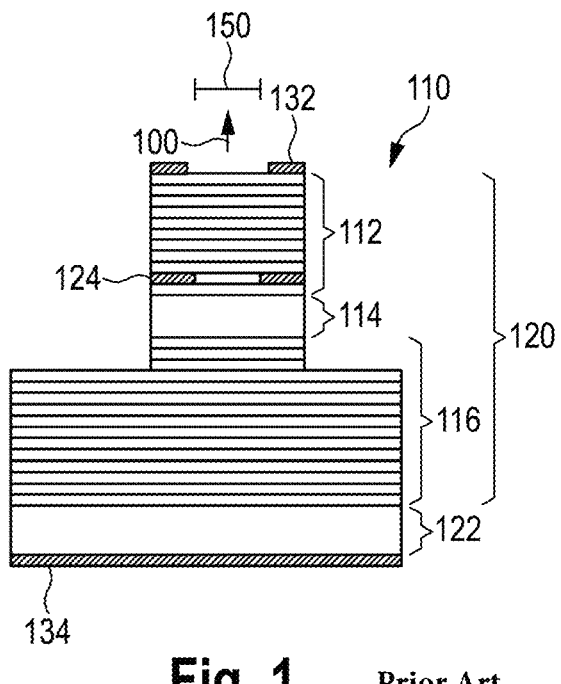
Fig. 1          Prior Art
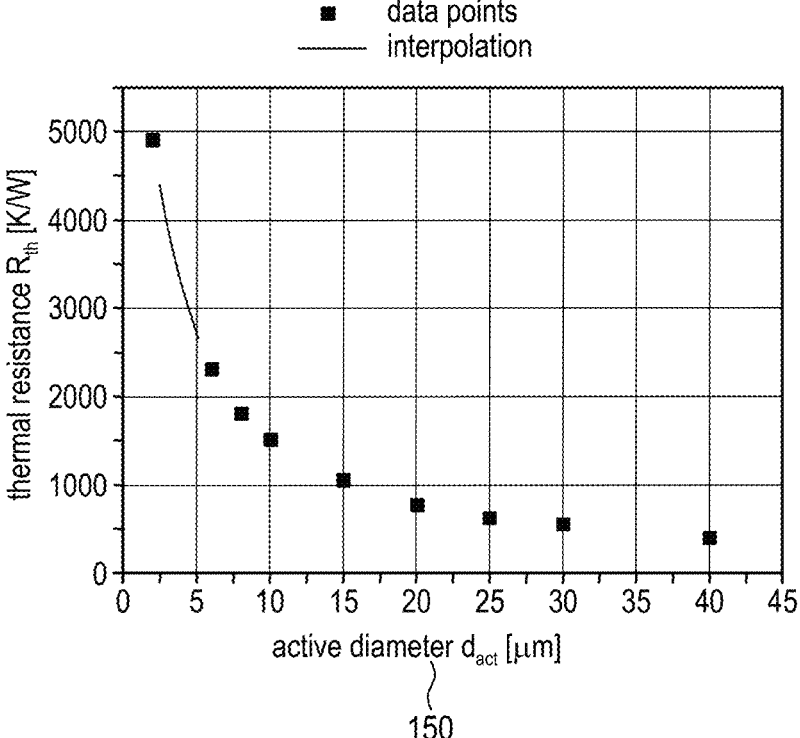
Fig. 2

S10, S20

S30

S10

S12

S14

S16

S18

VCSEL WITH INCREASED WAVELENGTH DEPENDENCE ON DRIVING CURRENT

CROSS REFERENCE TO RELATED APPLICATIONS

This application is a continuation of International Application No. PCT/EP2021/058457 (WO 2021/198345 A1), filed on Mar. 31, 2021, and claims benefit to European Patent Application No. EP 20167125.2, filed on Mar. 31, 2020. The aforementioned applications are hereby incorporated by reference herein.

FIELD

The present invention relates to a Vertical Cavity Surface Emitting Laser (VCSEL) with an increased wavelength dependence on the driving current. The present invention further relates to an optical sensor comprising such a VCSEL. The present invention further relates to a corresponding method of fabricating such a VCSEL.

BACKGROUND

When designing the epitaxial layer stack for efficient and reliable VCSELs, one always seeks to reduce the optical and electrical losses and to increase the heat removal from the active layer. Optical losses are of special concern closed to the active layer since the optical intensity and accordingly the optical absorption is highest close to the active layer. Additionally, a high electrical resistance close to the active layer is undesirable as the electrical losses close to the active layer increase the temperature of said active layer and reduce the efficiency of the VCSEL and presumably even the lifetime.

There is a typical wavelength shift when a VCSEL is operated at different currents. This wavelength shift as a function of driving current is an important parameter for sensor applications that rely on self-mixing interference, where nowadays typically VCSELs with integrated photodiodes (ViP) are used. The wavelength shift is typically larger for VCSELs with small active diameters of laser emission so that sensor applications that strive for a high wavelength shift typically use VCSELs with very small active diameters down to only 1 or 2 μm. An upcoming problem is that for the same laser driving current, a VCSEL with a small active diameter is driven at much higher current densities, which could reduce reliability.

US 2014/0023380 A1 discloses a VCSEL comprising a cavity extending region formed between one of the reflectors and the active region, which has an optical film thickness greater than an oscillation wavelength, and which includes an optical loss causing layer at at least one node of a standing wave of a selected longitudinal mode.

US 2019/0173263 A1 discloses a VCSEL having a laminated structure, wherein at least two light absorbing material layers are formed in parallel to a virtual plane occupied by the active layer.

US 2016/0064899 A1 discloses a VCSEL having first and second semiconductor multilayer reflectors, a cavity region between the multilayer reflectors, and a columnar structure extending from one of the reflectors to the cavity region, and a current confinement layer formed inside the columnar structure, wherein the cavity region includes an active region, and a cavity extension region interposed between the active region and one of the multilayer reflectors.

US 2007/0041414 A1 discloses a VCSEL containing at least one absorbing layer in its laser resonator, wherein the absorbing layer reduces the transmission of the laser radiation in the laser resonator for the purpose of decreasing the sensitivity of the laser to disturbances created by a radiation fed-back into the laser resonator. This reduces fluctuations in the output power due to fed-back radiation.

Xuefei Tang et al. describe in "Observation of Bistability in GaAs Quantum-Well Vertical-Cavity Surface-Emitting Lasers", IEEE Journal of Quantum Electronics, IEEE Service Center, Piscataway, NJ, USA, vol. 33, no. 6, 1 June 1997 emission spectra of VCSELs at different driving currents, wherein the emission spectra shift to longer wavelengths with increasing current.

U.S. Pat. No. 5,745,515 A discloses a VCSEL having an increasing absorption layer within one of the mirrors of the laser. The increasing absorption layer exhibits an increasing absorption coefficient in response to increasing current through the laser by increasing the temperature or carrier concentration of the layer to prevent the output power from the laser from exceeding a preselected magnitude for eye-safety.

SUMMARY

In an embodiment, the present disclosure provides a Vertical Cavity Surface Emitting Laser (VCSEL) that includes an optical resonator with a first reflector, a second reflector, and an active region for laser emission arranged between the first reflector and the second reflector and remaining regions outside of the active region, and an electrical contact arrangement configured to provide an electrical drive current to electrically pump the optical resonator. The optical resonator further comprises a loss layer introducing optical and/or electrical losses to increase wavelength shift of the laser emission when varying the drive current. If the loss layer is an optical loss layer, the optical losses introduced by the loss layer are higher than the sum of the optical losses in the remaining regions of the optical resonator. If the loss layer is an electrical loss layer, the electrical losses introduced by the loss layer are higher by a factor of at least 5 than the electrical losses in the remaining regions of the optical resonator.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 1 shows a principle sketch of a VCSEL as known in the art;

FIG. 2 shows a diagram illustrating a typical behavior of the thermal resistance in dependence on the active diameter of a VCSEL as known in the art;

DETAILED DESCRIPTION

Figure 3:
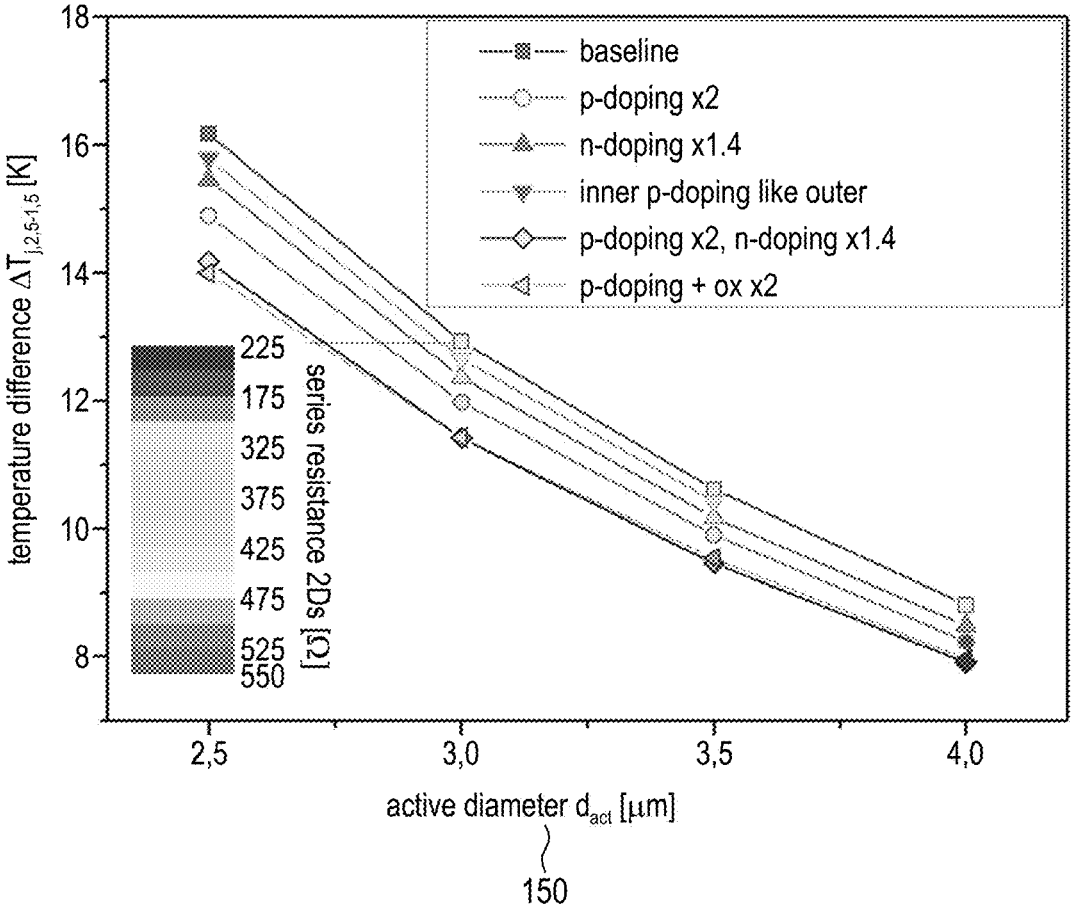
FIG. 3 shows a diagram illustrating the typical behavior of the temperature difference in dependence on the active diameter for different dopings of a VCSEL as known in the art.

It is an aspect of the present invention to provide an improved VCSEL which provides increased wavelength dependence on the driving current for a fixed active diameter of the VCSEL. Further, it is an aspect of the present invention to provide a corresponding method of fabricating such a VCSEL and to provide an optical sensor comprising such a VCSEL.

In a first aspect of the present invention a VCSEL is presented that comprises:

an optical resonator with a first reflector, a second reflector, and an active region for laser emission arranged between the first reflector and the second reflector; and an electrical contact arrangement which is arranged to provide an electrical drive current to electrically pump the optical resonator, wherein the optical resonator further comprises a loss layer providing optical and/or electrical losses to increase wavelength shift of the laser emission when varying the drive current, wherein, if the loss layer is an optical loss layer, the optical losses introduced by the loss layer are higher than the sum of the optical losses in the remaining regions of the optical resonator, and wherein, if the loss layer is an electrical loss layer, the electrical losses introduced by the loss layer are higher by a factor of at least 5 than the electrical losses in the remaining regions of the optical resonator, which remaining regions do not include the active region.

In a further aspect of the present invention a corresponding method of fabricating such a VCSEL is presented, which comprises the steps of:

providing an optical resonator; and electrically contacting the optical resonator for providing an electrical drive current to electrically pump the optical resonator (20), wherein the step of providing an optical resonator comprises the steps of providing a first reflector, providing an active region for laser emission, and providing a second reflector, providing a loss layer which provides optical and/or electrical losses to increase wavelength shift of the laser emission when varying the drive current, wherein, if the loss layer is an optical loss layer, optical losses introduced by the loss layer are higher than the sum of the optical losses in the remaining regions of the optical resonator, and wherein, if the loss layer is an electrical loss layer, the electrical losses introduced by the loss layer are higher by a factor of at least 5 than in the remaining regions of the optical resonator, which remaining regions do not include the active region.

In yet further aspect of the present invention, there is provided an optical sensor comprising such a VCSEL.

Preferred embodiments of the invention are defined in the dependent claims. It shall be understood that the claimed method as well as the claimed optical sensor have similar and/or identical preferred embodiments as the claimed VCSEL, in particular as defined in the dependent claims and as disclosed herein.

Many sensor applications using VCSELs nowadays rely on a wavelength shift of the emission wavelength of the VCSEL. An increased wavelength shift enables, e.g., much more accurate sensor measurements that rely on self-mixing interference. The present invention is based on the insight that reducing the active diameter of a VCSEL leads to the desired wavelength shift, but also to several drawbacks, such as a reduced operating reliability of the VCSEL.

In an embodiment, the present invention thus provides a completely different solution to increase the wavelength dependency on driving current. In an embodiment, the present invention provides an increased wavelength dependency on the driving current which does not depend on the VCSEL's active diameter. The invention is based on the surprising effect that a loss layer purposefully provided in the optical resonator of the VCSEL, which provides optical and/or electrical extra losses beyond the usual or ordinary losses in a VCSEL, leads to an increased wavelength shift of a VCSEL for a same driving current variation in comparison with a VCSEL with same active diameter but without such loss layer. The optical and/or electrical losses which are introduced by the loss layer may exceed the optical and/or electrical losses in the remaining parts or regions in the optical resonator. In case of electrical losses the losses introduced by the loss layer may exceed the electrical losses by a factor of at least 5, e.g. by a factor of more than 10, wherein the active region is not included in this comparison. In case of optical losses introduced by the loss layer, the optical losses may be higher than the optical losses in the remaining regions of the optical region, wherein the active region is not included in this comparison. The optical losses introduced by the loss layer may be higher by at least a factor of 2; 5; 10; or even 100 or more than 100. The optical and/or electrical extra losses introduced by the loss layer even exceed the sum of all other losses in the optical resonator, wherein the active region is not included in this comparison.

The VCSEL preferentially further comprises a photodiode region integrated into the resonator, e.g. into one of the reflectors, and wherein the optical losses introduced by the loss layer are higher than in the photodiode region. The losses introduced by the loss layer even exceed the sum of all other losses in the optical resonator including the photodiode region, when the active region is not included in this comparison. The loss layer may introduce optical as well as electrical losses, i.e. the loss layer may have the function of an optical loss layer as well as an electrical loss layer.

The losses introduced by the loss layer may be characterized, in case of an optical loss layer, by the difference in the optical power flux, seen perpendicular to the loss layer, at the begin and the end of the loss layer, divided by the thickness of the loss layer (also referred to herein as optical losses per layer thickness). In case of an electrical loss layer, the electrical losses introduced by the electrical loss layer may be characterized by the electrical current density in the loss layer multiplied with the voltage drop across the loss layer and divided by the thickness of the loss layer (also referred to herein as electrical losses per layer thickness).

The loss layer is implemented to act as a local heat source within the resonator of the VCSEL which locally increases the temperature of the VCSEL leading to an increased wavelength shift of laser emission when varying the driving current. The intrinsic optical and/or electrical losses of the VCSEL thus are intentionally increased. In other words, the loss layer is a layer which is intentionally not optimized for the reduction of optical or electrical losses. These considerations are counterintuitive to what is typically intended in the field of VCSELs, namely the reduction of electrical and optical losses. The VCSEL according to the invention may have a plurality of loss layers.

The first reflector and the second reflector of the VCSEL may, e.g., be commonly known distributed Bragg reflectors (DBRs). In the following, the expressions first DBR and second DBR may thus be alternatively used for the first and second reflector of the VCSEL. It shall be understood, however, that the present invention is not limited to a VCSEL with DBRs. The reflectors may also be other suitable reflectors/mirrors as known in the art, such as dielectric mirrors.

According to an embodiment, the loss layer may be arranged between the active region and the first reflector or between the active region and the second reflector, or may be a first layer of the first reflector or a first layer of the second reflector which first layer faces the active region. In said context, the loss layer may be either arranged on the n-side or on the p-side of the active region. It shall be understood, however, that the present invention is not limited to the use of one loss layer arranged as described above. It may also be an option to provide two or more loss layers, e.g., one below the active region and another one above the active region. This can further increase the optical and/or electrical losses and lead to an improved wavelength shift at the same driving current variation. Nevertheless, a compromise has to be found as losses may also reduce the efficiency of the device and probably even the lifetime.

According to an embodiment, the loss layer may be arranged in contact to the active region. This is of particular interest if the loss layer provides optical losses, i.e. if the loss layer has a large optical absorption coefficient in the wavelength range in which the VCSEL is operating. If the loss layer is arranged directly below or directly above the active region, an efficient absorption of the radiation intensity can be achieved. This leads to a temperature increase which, in turn, increases the emission wavelength dependence on laser current accordingly.

Preferably, the loss layer thus may comprise a material with a fundamental absorption at the emission wavelength of the VCSEL. The VCSEL is preferably operating in the visible or near-infrared optical range. Hence, the loss layer may comprise GaAs or $Al_xGa_{1-x}As$ with x being in a range from 0 to 0.1. GaAs is, e.g., highly absorbing at a wavelength of 850 nm at which the VCSEL may have its emission wavelength. In this context or in the context of other embodiments, in which electrical extra losses are introduced by the loss layer, the thickness of the loss layer is preferably in a range from 5 and 30 nm. Also here, a compromise has to be found. The thickness has to be large enough to provide sufficient electrical and/or optical losses, but the thickness does not have to be too large as this may lead to a critical temperature increase which reduces reliability and probably even the lifetime of the VCSEL.

The loss layer may further comprise a doping which is higher than the doping of the first or second reflectors. If the first reflector and the second reflector of the VCSEL are DBRs with multiple DBR layers, respectively, the loss layer may comprise a doping larger than the doping of the DBR layers.

According to said embodiment, the doping is preferably larger than $5 \cdot 10^{18}$ cm$^{-3}$, but may depend on the choice of material of the loss layer.

As already explained above, arranging the loss layer close to the active layer provides advantages. The loss layer may, however, also be arranged either in an antinode or in a node of a standing wave pattern of the VCSEL. The arrangement in an antinode of a standing wave pattern of the VCSEL is especially preferred if the loss layer provides optical losses, i.e., if the optical absorption coefficient is large. A standing wave is a wave which oscillates in time but whose peak amplitude profile does not move in space. If the loss layer is arranged in an antinode of the standing wave pattern, the amplitude (or intensity) of the optical standing wave is maximum. Hence, the optical absorption is large for this arrangement as lots of optical intensity is located in the absorbing loss layer. Alternatively, it may also be an option to arrange the loss layer in a node of the standing wave pattern where the absorption is less. This might be an option if the material of the loss layer already comprises a large intrinsic optical absorption at the emission wavelength of the VCSEL to not heat the VCSEL too much.

Alternatively to the high doping of the loss layer described above, the loss layer may also have a doping lower than the doping of the reflectors. If the first reflector and the second reflector of the VCSEL are DBRs with multiple DBR layers, respectively, the loss layer may comprise a doping smaller than the doping of the DBR layers. According to said embodiment, the doping is preferably less than $1 \cdot 10^{18}$ cm$^{-3}$. The loss layer may even be undoped. In this case, the optical absorption is reduced but the electrical resistance and thus electrical losses increase and lead to a stronger dependence of the laser wavelength on the laser current via Ohmic heating. Again, such a layer could be placed on both sides (n- or p-side) of the active region.

For such a low-doped or undoped loss layer, which provides a large electrical resistance, it is, however, preferred if it is arranged close to a current confinement layer, where the current density is highest. Such a current confinement layer is well known in the art and typically forms an aperture, where the current path is confined. The current confinement layer may be configured as an oxide aperture. It is also an option to configure the loss layer itself as the current confinement layer. In this case, the loss layer may be provided with a doping below $1 \cdot 10^{18}$ cm$^{-3}$, which is untypical for commonly known VCSELs.

Besides the above-mentioned embodiments of the loss layer, it is also an option to provide a hetero-layer as loss layer. This hetero-layer is preferably formed from at least a first layer with a high first refractive index and a second layer with a low second refractive index, and the transition between the first layer and the second layer is step-like. This is different to typical transitions between materials with high and low refractive index known in the art, where the transition is typically graded as well as modulation-doped to increase the transversal conductivity. A step-like transition between a first layer with, e.g., a small refractive index and a second layer with, e.g., a large refractive index decreases the transversal conductivity and thus increases the resistance. For this reason, such a hetero-layer is a suitable choice for the loss layer to provide electrical extra losses.

The VCSEL preferably comprises an integrated photodiode as indicated above. The photodiode may be integrated into the optical resonator (intra-cavity photodiode) The VCSEL may comprise a substrate onto which the layer stack of the VCSEL with integrated photodiode is grown. The substrate may be removed after the VCSEL is produced.

The VCSEL may be a top emitter or a bottom emitter.

It shall be understood that a preferred embodiment of the invention can also be any combination of the dependent claims with the respective independent claim.

Further advantageous embodiments are defined below.

These and other aspects of the invention will be apparent from and elucidated with reference to the embodiments described hereinafter with reference to the drawings.

FIG. 1 shows a principle sketch of a VCSEL 110 as known in the art. The VCSEL 110 comprises a first reflector 112, an active region 114 for laser light emission and a second reflector 116. The first reflector and the second reflector of the VCSEL 110 may, e.g., be commonly known distributed Bragg reflectors (DBRs). In the following, the expression of first DBR and a second DBR may thus be alternatively used for the first and second reflector 112, 114 of the VCSEL 110. The active region 114 is arranged between the first and the second DBRs 112, 116. The first DBR 112, the active region 114 and the second DBR 116 form an optical resonator 120, which further comprises a current confinement layer 124 which is typically arranged near the active region 114 in order to match the current distribution of the optical mode of the VCSEL 110. This current confinement layer 124 confines current to a predefined active area with an active diameter 150. In general, the smaller this active diameter 150, the larger the wavelength shift of the VCSEL 110 if the driving current is changed.

The second DBR 116, the active region 114 and the first DBR 112 may be epitaxially grown on a substrate 122. The layers of the first and second DBRs 112, 116 may, for example, comprise doped AlGaAs.

In case the VCSEL 110 is a top emitter, the first DBR 112 may be partly transmissive for the laser radiation generated in the active region 114. The laser light is emitted by the VCSEL 110 as illustrated by an arrow 100. The first DBR 112 may have a reflectivity which is lower than the reflectivity of the second DBR 116 in case of a top emitter. It is to be understood that the VCSEL 110 may also be configured as a bottom emitter, i.e. laser light may be emitted on the substrate side of the VCSEL 110, wherein then the reflectivity of the first DBR 112 is higher than the reflectivity of the second DBR 116. The substrate 122 may be removed.

The VCSEL 110 as shown in FIG. 1 further comprises an electrical contact arrangement 132, 134, which comprises a first contact 132 on top of the first DBR 112, a second contact 134 on the bottom of the substrate 122. This electrical arrangement 132, 134 is arranged to provide an electrical drive current to electrically pump the optical resonator 20.

For VCSELs as shown in FIG. 1 it is known that a typical wavelength shift occurs when the VCSEL is operated at different currents. This wavelength shift is for example an important parameter for sensor applications that rely on self-mixing interference. The wavelength shift is typical larger for VCSELs with small active diameters (cf. active diameter 150 in FIG. 1) so that sensor applications that strive for a high wavelength shift typically use VCSELs with very small active diameters. This trend becomes apparent from subsequent FIG. 2.

FIG. 2 shows a diagram illustrating a typical behavior of the thermal resistance in dependence on the active diameter 150 of a VCSEL as known in the art. It becomes apparent that the smaller the active diameter 150, the larger the thermal resistance $R_{th}$. Further, a large thermal resistance $R_{th}$ refers to a large temperature shift as explained in the following.

The laser emission wavelength of a VCSEL is mainly determined by the VCSEL temperature $T_j$ and said VCSEL temperature is given by the heat sink temperature $T_{HS}$, the thermal resistance $R_{th}$ and the dissipated power $P_{diss}$:

$$T_j = T_{HS} + R_{th} \cdot P_{diss}.$$

The dissipated power is the difference between electrical input power $P_{el}$ and optical output power $P_{opt}$:

$$P_{diss} = P_{el} - P_{opt}.$$

The electrical input power depends on the kink voltage $U_k$, the differential resistance $R_{diff}$ and the laser current I:

$$P_{el} = (U_k + R_{diff} \cdot I) \cdot I.$$

The optical output power depends on the slope efficiency $\eta_{sl}$ and the threshold current $I_{th}$:

$$P_{opt} = \eta_{sl} \cdot (I - I_{th})$$

Based on the layer structure it is possible to calculate the parameters $\eta_{sl}$, $I_{th}$, $U_k$ and $R_{diff}$ for a given VCSEL active diameter 150 and these parameters are used to calculate the temperature difference that the VCSEL experiences by exemplarily increasing the current from 1.5 mA to 2.5 mA for different diameters:

$$\Delta T_{j,2.5-1.5} = R_{th} \cdot (P_{diss}(2.5 \text{ mA}) - P_{diss}(1.5 \text{ mA}))$$

Hence, a larger thermal resistance $R_{th}$ (which belongs to a smaller diameter 150 as shown in FIG. 2) results in a larger temperature difference/temperature shift. This temperature shift in turn leads to a wavelength shift. For this reason, sensor applications that strive for a high wavelength shift, such as sensor applications that rely on self-mixing interference, typically use VCSELs with very small active diameters 150 down to only 1 or 2 μm.

FIG. 3 shows a diagram illustrating the typical behavior of the temperature difference $\Delta T_{j,2.5-1.5}$ in dependence on the active diameter 150 for different dopings of a VCSEL as known in the art. The upper curve ("baseline") in FIG. 3 belongs to a reference VCSEL with a reference doping of the n-DBR and the p-DBR. The VCSEL may be designed as shown in FIG. 1.

The other curves belong to VCSELs where the n-doping or p-doping of the DBRs is changed or modified in comparison to the reference VCSEL. These curves illustrate for example VCSEL, where the n-doping or p-doping is by a factor of 1.4 or by a factor of 2 larger than the doping of the reference VCSEL.

It becomes apparent from the diagram shown in FIG. 3 that increasing the doping level shifts the curves to lower temperature differences $\Delta T_{j,2.5-1.5}$. Hence, only modifying the doping of a VCSEL seems not to be a promising aspect for a large shift of the emission wavelength of a VCSEL.

FIGS. 2 and 3 illustrate that there seems to only remain the aspect of decreasing the active diameter of a VCSEL as shown in FIG. 2 to obtain a high wavelength shift, but this leads to higher current densities which presumably reduces reliability of the VCSEL. The present invention is, however, able to overcome these disadvantages and provides a reliable VCSEL, which provides a large wavelength shift based on a completely different principle as explained with reference to the subsequent figures.

Figure 4:
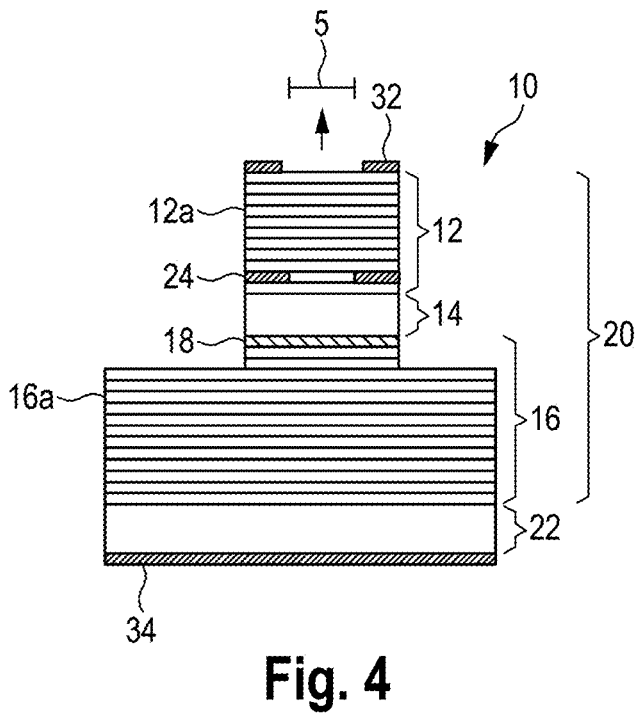
FIG. 4 shows a principle sketch of a VCSEL according to the present invention.

FIG. 4 shows a principle sketch of a VCSEL 10 according to the present invention. The VCSEL 10 comprises a first reflector 12 which may be configured as a DBR (consisting of a plurality of first DBR layers 12*a*), an active region 14 for laser light emission and a second reflector 16 which may be configured as a DBR (consisting of a plurality of second DBR layers 16*a*). In the following description, the expression of a first DBR and a second DBR may thus be alternatively used for the first and second reflector 112, 114 of the VCSEL 110. The active region 14 is arranged between the first and second reflectors 12, 16. Differently from VCSELs known in the art (e.g. VCSEL 110 shown in FIG. 1), the VCSEL 10 of FIG. 4 comprises a loss layer 18, which provides optical and/or electrical extra losses as described above and as further described below. The first reflector 12, the active region 14, the loss layer 18 and the second reflector 16 form an optical resonator 20, which further comprises a current confinement layer 24 with an active diameter 5.

The VCSEL 10 as shown in FIG. 4 comprises an electrical contact arrangement 32, 34, which comprises a first contact 32 on top of the first DBR 12, a second contact 34 on the bottom of the substrate 22. This electrical arrangement 32, 34 is arranged to provide an electrical drive current to electrically pump the optical resonator 20.

The layer stacks of the second DBR 16, the loss layer 18, the active region 14 and the first DBR 12 may be epitaxially grown on a substrate 22. It shall be understood that the arrangement of the loss layer 18 in FIG. 4 is not limited. However, the loss layer 18 is preferably arranged between the active region 14 and the first DBR 12 or between the active region 14 and the second DBR 16. Hence, the loss layer 18 may be arranged in contact to the active region 14. The losses provided by the loss layer 18 may, for example, be optical losses, where optical absorption is accomplished, e.g., by the choice of the material composition of the loss layer 18 and the surrounding other layers. A VCSEL with an emission wavelength of around 850 nm can for example use a 5-30 nm thin GaAs loss layer 18 close to the active layer 14 (as shown in FIG. 4) arranged either on the n- or on the p-side of the active layer 12. Further details on the choice of material of the loss layer 18 are explained below with reference to FIGS. 7-9.

At a wavelength of 850 nm GaAs is highly absorbing and causes a large loss and accordingly a large additional heating of the VCSEL 10. In addition, when the current of the laser is increased, more photons are present in the cavity, will be absorbed and therefore increase the heat generated close to the active layer 14. This in turn will result in an increased wavelength dependence on laser (driving) current as compared to commonly known VCSELs (as shown, e.g., in FIG. 1) which do not have such a loss layer 18. By choosing different materials and thicknesses of the loss layer 18, the absorption coefficient can be tuned and the wavelength shift can be optimized for a desired active diameter 5. Another option to tune the optical losses is the placement of this highly absorbing loss layer 18 in a standing wave pattern of the VCSEL 10. Depending on whether the loss layer 18 is placed in a node or antinode of the optical intensity pattern, there will be more or less absorption and accordingly heating in the structure. This leads to a larger shift of the wavelength for a given laser current variation, as explained already with reference to FIG. 2.

Another option to realize the high optical absorption is to use a highly doped loss layer 18 in the vicinity of the active layer 14. While the absorption is in this case due to free carrier absorption rather than absorption within the band edge of the semiconductor, the same considerations as for the optical absorptions due to the material composition apply. Again, placement of this layer can be on the p- as well as on the n-side of the active layer 14, and preferably the electrically active doping level for this layer is above $5 \cdot 10^{18}$ cm$^{-3}$.

Another option to realize the increased wavelength shift of the VCSEL 10 is to increase electrical losses due to the loss layer 18. This can be done by implementing a low-doped or even undoped loss layer 18 close to the active region 14. In this case, the optical absorption is reduced, but the electrical resistance increases and leads to a stronger dependence of the wavelength of the laser emission of the VCSEL 10 on the laser current via Ohmic heating. Again, such a loss layer 18 may be placed on both sides of the active region 14.

Additionally, it is an option to place said loss layer 18 close to the current confinement layer 24, where the current density is highest. This is exemplarily illustrated in FIG. 5. It is also an option to configure the loss layer 18 itself as the current confinement layer which provides the current aperture, configured, e.g., as an oxide aperture. In this case, the loss layer may be provided with a doping below $1 \cdot 10^{18}$ cm$^{-3}$. An additional confinement layer is not necessary in such embodiment.

Figure 5:
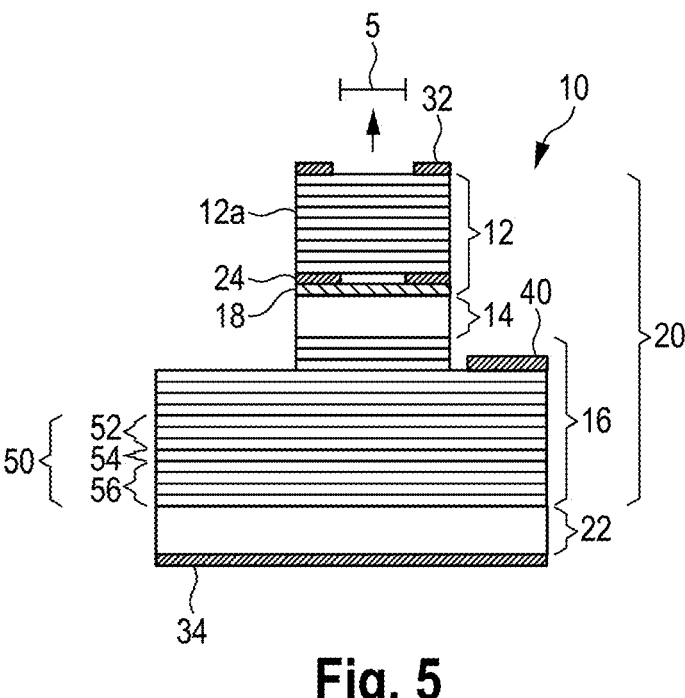
FIG. 5 shows a principle sketch of another embodiment of a VCSEL according to the present invention with an integrated photodiode.

FIG. 5 shows a principle sketch of another embodiment of a VCSEL according to the present invention with an integrated photodiode 50. In the embodiment shown in FIG. 5, the photodiode 50 is integrated in the optical resonator 20 and the VCSEL 10 further comprises another electrical contact 40 to contact the photodiode 50. Integration of the photodiode 50 into the second DBR 16 as shown in FIG. 5 may be accomplished as follows. The second DBR 16 may consist of three areas starting for example below the active region 14 with n-doped layers, changing to p-doped layers 52 followed by an intrinsic absorption layer 54 of the photodiode 50 placed around an antinode of the standing wave pattern in order to get maximum responsibility and maximum contrast of stimulated versus spontaneous emission of the VCSEL 10. The p-i-n structure of the photodiode 50 is finished by further n-doped layers 56.

Such a VCSEL 10 with an integrated photodiode (ViP) is nowadays typically used for sensor applications that rely on self-mixing interference. The present invention proposes to modify the fabrication design (such as the epitaxial design) of a VCSEL such that a loss layer 18 with additional or extra losses is brought in close vicinity to the active layer 14 to increase the wavelength shift of the VCSEL 10. In combination with an integrated photodiode 50 as shown in FIG. 5 such a design of a VCSEL 10 is well-suited for many sensor applications based on self-mixing interference.

Figure 6:
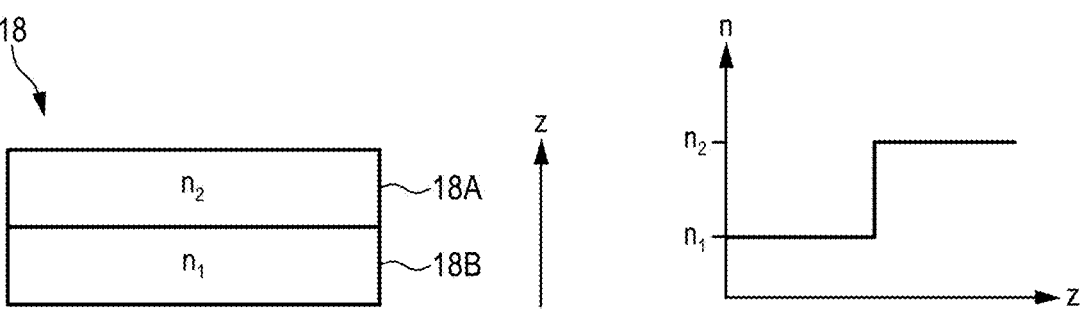
FIG. 6 shows a schematic diagram of an embodiment of the loss layer of a VCSEL according to the present invention.

FIG. 6 shows a schematic diagram of another embodiment of the loss layer 18 of a VCSEL 10 according to the present invention. The loss layer 18 may be a hetero-layer comprising at least two different layers 18A, 18B. This hetero-layer has a low transversal conductivity in z-direction (epitaxial growth direction) and may be placed near the active region 14 (compare FIGS. 4 and 5). Realizing one transition as a step between a low ($n_1$) and a high refractive index ($n_2$) material creates a barrier for electron transport and increases the electrical resistance in this loss layer 18. This is different to commonly used transitions between materials with high and low refractive index, where the transition is typically graded as well as modulation-doped to increase the transversal conductivity and to reduce resistance. Here, the step-like transition between the two layers 18A, 18B from a low ($n_1$) to a high refractive index ($n_2$) (cf. also diagram on the right of FIG. 6) increases the electrical resistance and the effect will be an increased wavelength shift for the VCSEL 10.

Figure 7:
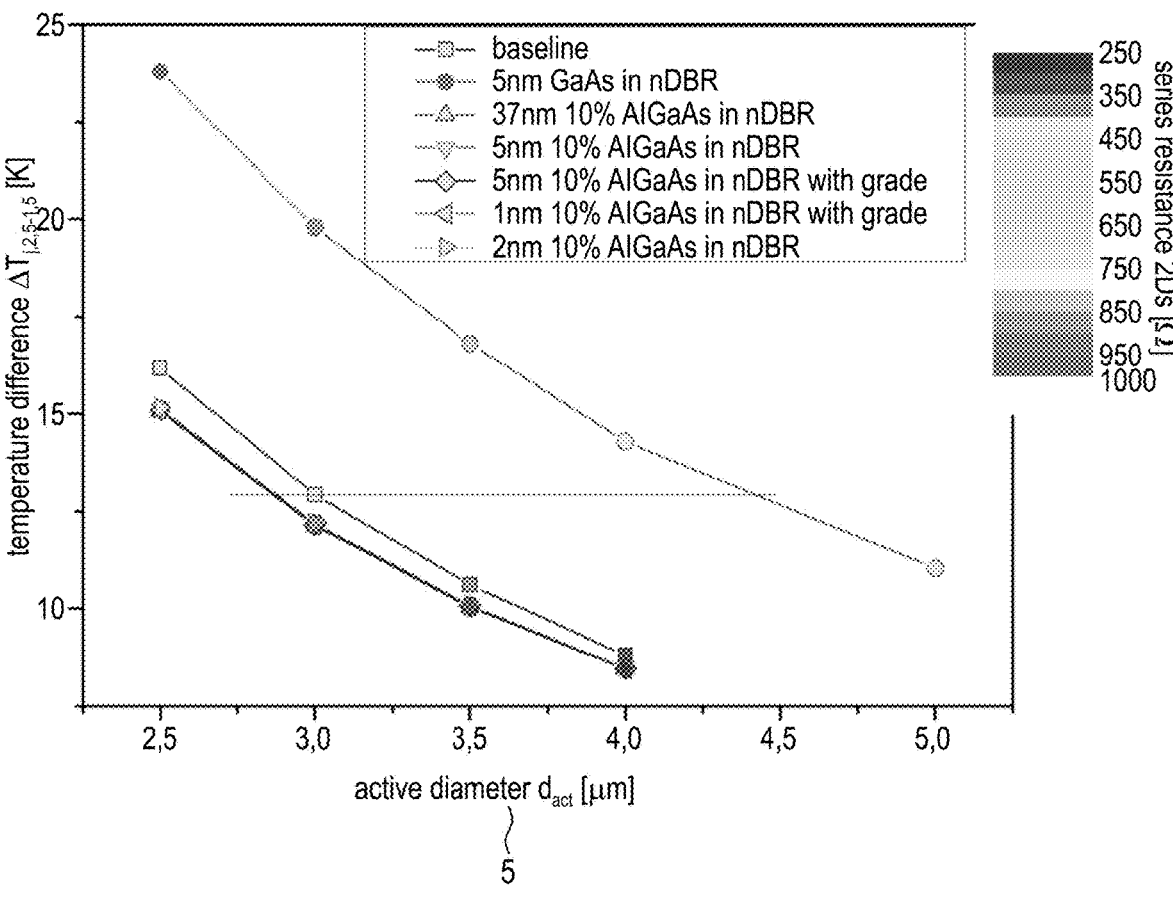
FIG. 7 shows a diagram illustrating a temperature difference in dependence on the active diameter for different dopings of a VCSEL according to the present invention.

FIG. 7 shows a diagram illustrating the typical behavior of the temperature difference $\Delta T_{j,2.5-1.5}$ in dependence on the active diameter 5 for different dopings of a VCSEL 10 according to the present invention. The curve formed by the squared symbols ("baseline") refers to a reference VCSEL without having any loss layer 18. The other curves belong to VCSELs with an additional loss layer 18 according to the present invention. This loss layer 18 is exemplarily arranged in the n-DBR and has a thickness ranging from 1 nm to 37 nm for the different curves. The material of this loss layer 18 is either GaAs or $Al_{0.1}Ga_{0.9}As$.

It can be seen in the diagram of FIG. 7 that the implementation of a 5 nm GaAs-loss layer 18 has a large effect on the temperature difference $\Delta T_{j,2.5-1.5}$. A large band-edge absorption caused by the 5 nm GaAs-layer increases the optical losses and therefore $\Delta T_{j,2.5-1.5}$. Hence, implementing such a 5 nm GaAs-layer may be an interesting candidate for an improved VCSEL with increased wavelength shift.

The grey scale map inset shows, however, that the resistance and thus also the forward voltage increases much for the 5 nm GaAs-layer. This becomes even clearer from the histogram shown in the following FIG. 8.

Figure 8:
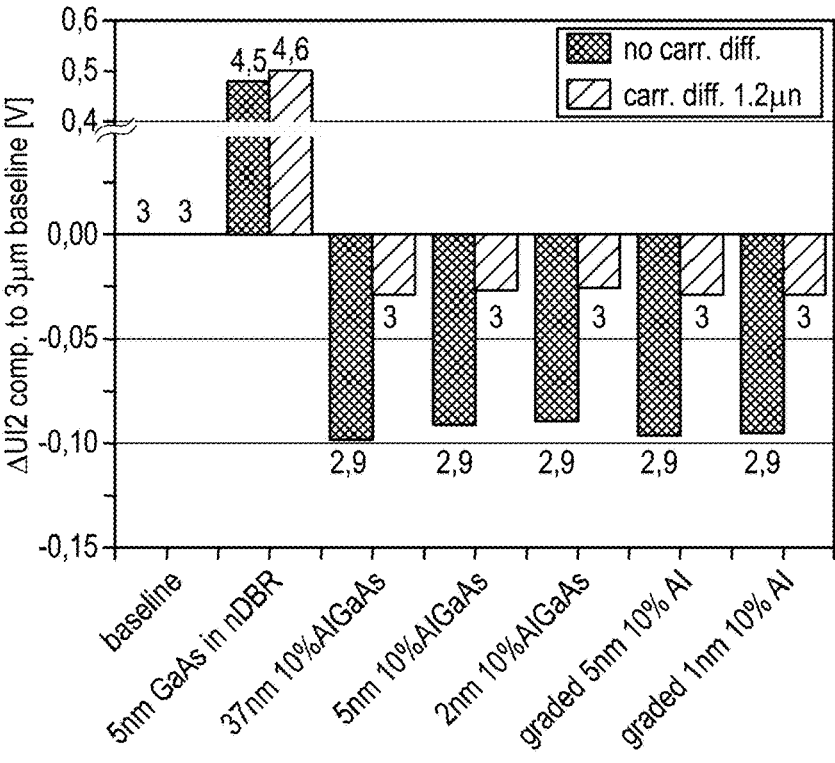
FIG. 8 shows a histogram illustrating the forward voltage difference for the different VCSEL dopings as shown in FIG. 7.

FIG. 8 shows a histogram illustrating the forward voltage difference for the different VCSEL dopings as shown in FIG. 7 and as explained with reference thereof. For each doping the forward voltage difference is further shown for a non-existing carrier diffusion as well as for a carrier diffusion of 1.2 µm. A thin GaAs layer with a thickness of 5 nm located in the nDBR leads to a voltage increase while all the other layers show a voltage reduction. Hence, a lower forward voltage can be obtained by different kinds of loss layers, such as $Al_xGa_{1-x}As$ layers with x being in a range from 0 to 0.1.

Figure 9:
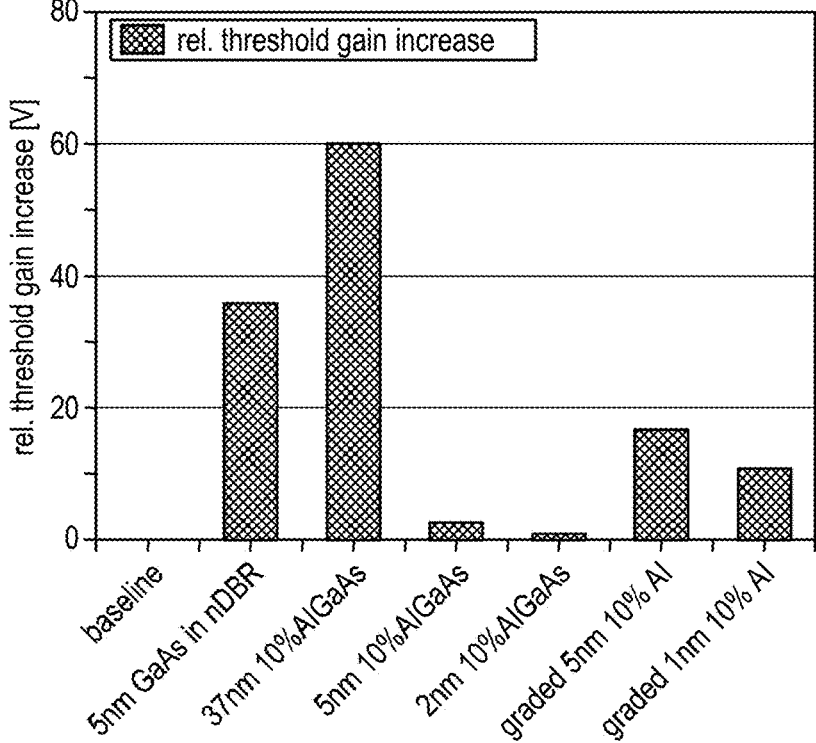
FIG. 9 shows a histogram illustrating the relative threshold gain increase for different VCSEL dopings as shown in FIG. 7.

FIG. 9 shows a histogram illustrating the relative threshold gain increase for different VCSEL dopings as shown in FIG. 7. For each doping the forward voltage difference is again further shown for a non-existing carrier diffusion. It can be seen that the different loss layers have a different influence on the relative threshold gain, which is, e.g., up to 60% larger for a 37 nm Al0.1Ga0.9As-layer. Hence, this kind of loss layer is not suitable as the impact of implementing such a loss layer on the threshold gain is too large. On the other hand, a 5 nm Al0.1Ga0.9As-layer provides the desired forward voltage reduction as shown in FIG. 8 and only leads to a relative threshold gain increase of some percent. Hence, the price to be paid is rather low in comparison to the decent reduction of the forward voltage. For this reason, a 5 nm Al0.1Ga0.9As-layer is, for example, a possible candidate for the loss layer 18 used according to the present invention.

Figure 10:
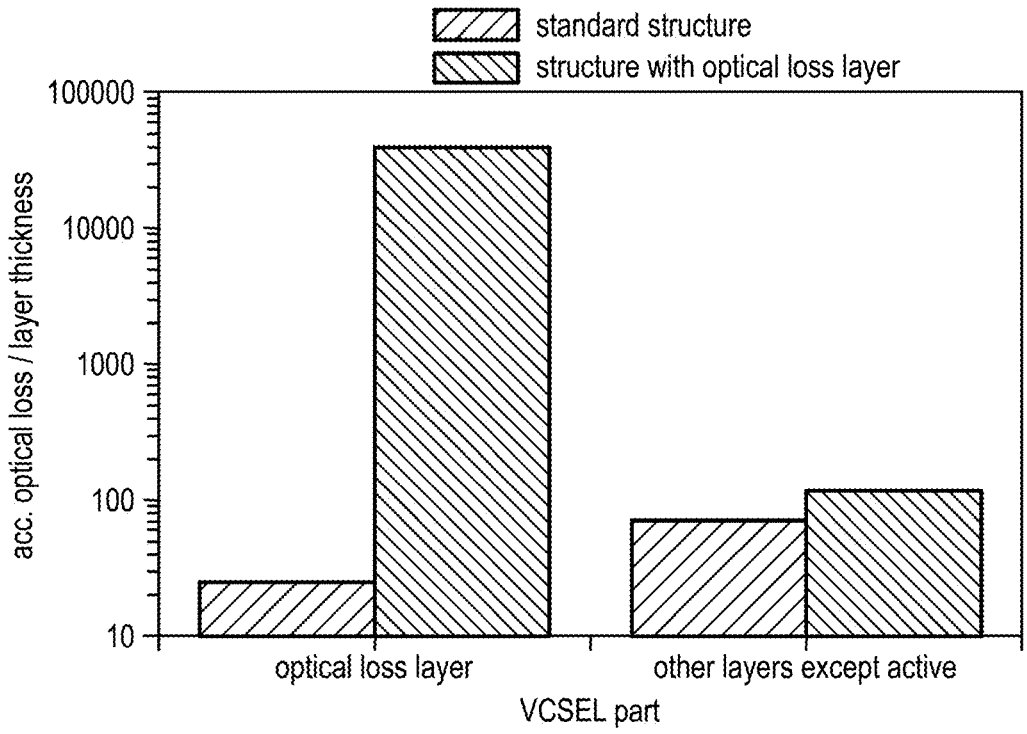
FIG. 10 shows a diagram illustrating a simulation of optical losses introduced by a loss layer in comparison to optical losses provided by remaining parts of an example VCSEL.

FIG. 10 shows a diagram of a simulation illustrating a comparison of optical losses in a standard structure of a VCSEL without optical loss layer with optical losses with a structure of a VCSEL according to the invention with optical loss layer according to the embodiments described herein.

The optical losses introduced by the loss layer may be characterized by the difference in optical power flux at the begin and the end of the loss layer (seen perpendicular to the loss layer), divided by the thickness of the loss layer. These introduced losses are compared with the corresponding optical losses in the remaining regions of the optical resonator except the active region. At the position, where the loss layer is arranged in the structure of the VCSEL according to the invention, certain material is naturally present in the standard structure so that there will be natural optical losses at this position in the standard structure, and therefore this material is called here 'optical loss layer' like in the VCSEL according to the invention. However, as can be seen in FIG. 10, the optical losses provided by the 'natural' optical loss layer of the standard structure are much lower than the accumulated losses per layer thickness in the remaining parts of the VCSEL which include at least the optical resonator, wherein the active region is not included in this comparison. In contrast, the optical losses per layer thickness introduced by the purposefully provided optical loss layer of the structure of a VCSEL according to the invention are higher by a factor of more than hundred than the accumulated optical losses in the remaining parts or regions of the VCSEL. This even holds, if the remaining parts or regions include an integrated photodiode.

Figure 11:
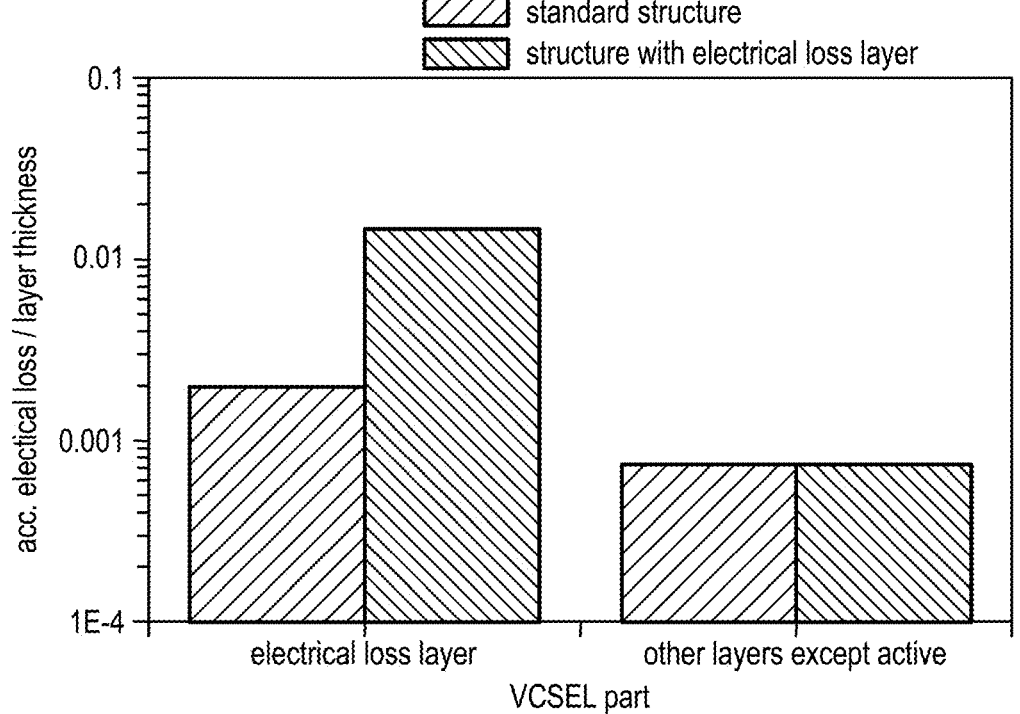
FIG. 11 shows a diagram illustrating a simulation of electrical losses introduced by a loss layer in comparison to optical losses provided by remaining parts of an example VCSEL.

FIG. 11 shows a diagram of a simulation illustrating a comparison of electrical losses per layer thickness in a standard structure of a VCSEL without electrical loss layer with electrical losses per layer thickness with a structure of a VCSEL according to the invention with electrical loss layer according to the embodiments described herein. The electrical losses introduced by the electrical loss layer may be characterized by the electrical current density in the loss layer multiplied with the voltage drop across the loss layer and divided by the thickness of the loss layer (Electrical losses per layer thickness). At the position, where the loss layer is arranged in the structure of the VCSEL according to the invention, certain material is naturally present in the standard structure so that there will be natural electrical losses at this position in the standard structure, and therefore this material is called here 'electrical loss layer' like in the VCSEL according to the invention. The electrical losses per layer thickness introduced by the purposefully provided electrical loss layer are again higher, by a factor of at least 10, than the accumulated electrical losses per layer thickness in the remaining parts or regions of the structure of the VCSEL. The 'natural' electrical loss layer which exhibits comparatively higher electrical losses than in the remaining parts of the VCSEL is the current confinement layer, e.g. an oxide aperture. This 'natural' electrical loss layer of the standard structure provides electrical losses which are only slightly higher, by a factor of about 2, than the accumulated losses in the remaining parts of the standard structure. The loss layer provided according to the invention however introduces electrical losses per layer thickness which are significantly higher, by a factor of at least ten, than the accumulated electrical losses in the remaining parts or regions.

Figure 12:
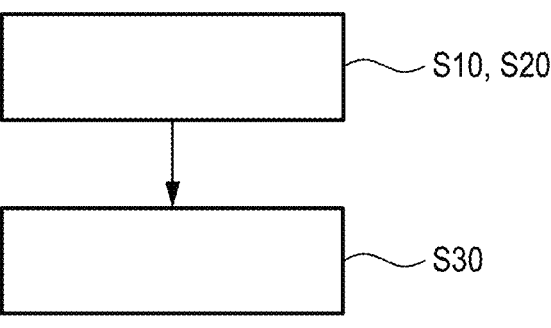
FIG. 12 shows a flowchart of a method of fabricating a VCSEL according to the present invention.

FIG. 12 shows a flowchart of a method of fabricating a VCSEL according to the present invention. In a first step S10, an optical resonator is provided. In the second step S20, the optical resonator is electrically contacted.

Figure 13:
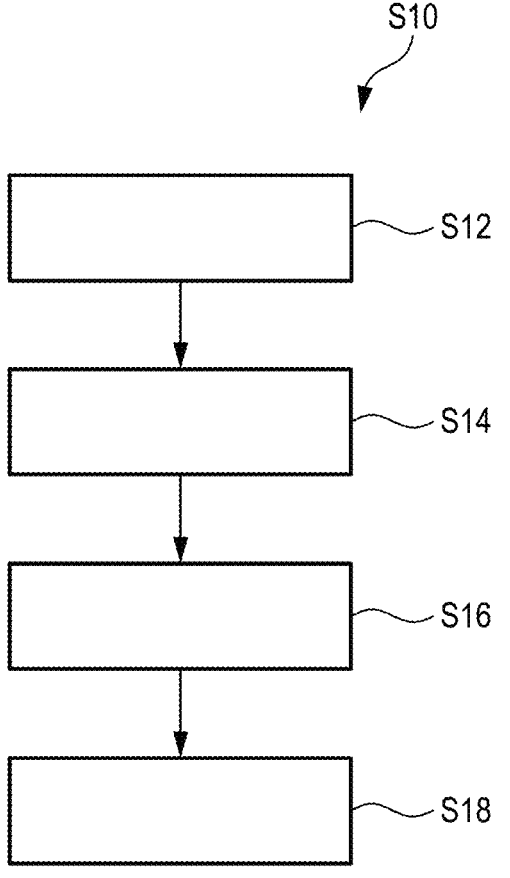
FIG. 13 shows a flowchart illustrating a method step of FIG. 12 in detail.

FIG. 13 shows a flowchart illustrating the method step S10 of providing an optical resonator of FIG. 12 in detail. In step S12, a second reflector, e.g. a distributed Bragg reflector (DBR) is provided. In step S14, a loss layer, which provides electrical and/or optical losses, is provided. In step S16, an active region for light emission is provided, and subsequently, in step S18, a first reflector, e.g. a distributed Bragg reflector is provided. It shall be noted that the layer stacks of the second DBR, the loss layer, the active region and the first DBR may be fabricated by any suitable technique known in the art. One example may be an epitaxial growth on a substrate, where the different layer stacks are epitaxially grown one after the other on the substrate according to the order of the steps S12, S14, S16 and S18 shown in FIG. 13.

Figure 14:
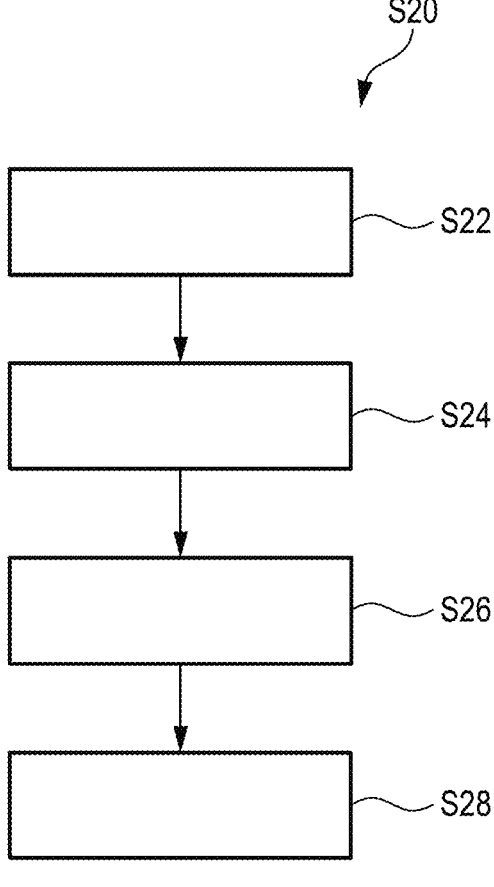
FIG. 14 shows a flowchart illustrating an alternative method step of FIG. 12 in detail.

FIG. 14 shows a flowchart illustrating an alternative method step S20 of providing an optical resonator of FIG. 10 in detail. In step S22, a second reflector, e.g. a DBR is provided. In step S24, an active region for light emission is provided. In step S26, a loss layer which provides optical and/or optical losses is provided, and subsequently, in step S28, a first reflector, e.g. a DBR is provided.

The method of fabrication as illustrated in FIG. 14 refers to a VCSEL design, where the loss layer is grown (e.g., by epitaxy) above the active region while the method of fabrication as illustrated in FIG. 13 refers to a VCSEL design, where the loss layer is grown (e.g., by epitaxy) below the active region.

It shall be understood that the method according to FIGS. 13 and 14 may also include the integration of a photodiode into the optical resonator.

It shall be further understood that the order of the steps shown in FIGS. 13 and 14 is only exemplarily and all these steps shall be considered as being equivalent. Further, it shall be understood that the method steps illustrated in FIGS. 13 and 14 are only alternative if one loss layer is provided (i.e., either below or above the active region). The present invention is, however, not limited to embodiments where only one loss layer is used. It may be an option to provide two or more loss layers to increase the electrical and/or optical losses even further. Nevertheless, a compromise has to be found as losses lead to a temperature decrease and reduces the efficiency of the device and probably even the lifetime.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A Vertical Cavity Surface Emitting Laser (VCSEL), comprising:
an optical resonator with a first reflector, a second reflector, and an active region for laser emission arranged between the first reflector and the second reflector; and
an electrical contact arrangement configured to provide an electrical drive current to electrically pump the optical resonator,
wherein the optical resonator further comprises a loss layer introducing losses to increase wavelength shift of the laser emission as the electrical drive current is varied, wherein the losses comprise optical losses at an emission wavelength of the VCSEL and electrical losses, wherein the optical losses introduced by the loss layer are higher than a sum of optical losses in remaining regions of the optical resonator outside of the active region, and the electrical losses introduced by the loss layer are higher by a factor of at least 5 than electrical losses in the remaining regions of the optical resonator.

2. The Vertical Cavity Surface Emitting Laser according to claim 1,
wherein the loss layer is arranged between the active region and the first reflector or between the active region and the second reflector, or is a first layer of the first reflector or a first layer of the second reflector which first layer faces the active region.

3. The Vertical Cavity Surface Emitting Laser according to claim 1, further comprising a photodiode region integrated into the resonator, and wherein the optical losses introduced by the loss layer are higher than in the photodiode region.

4. The Vertical Cavity Surface Emitting Laser according to claim 1, wherein the loss layer is arranged in contact to the active region.

5. The Vertical Cavity Surface Emitting Laser according to claim 1, wherein the loss layer comprises a material with a fundamental absorption at the emission wavelength of the Vertical Cavity Surface Emitting Laser.

6. The Vertical Cavity Surface Emitting Laser according to claim 1, wherein a thickness of the loss layer is in a range from 5 and 30 nm.

7. The Vertical Cavity Surface Emitting Laser according to claim 1, wherein the loss layer comprises a doping is higher than a doping of the first or second reflectors.

8. The Vertical Cavity Surface Emitting Laser according to claim 1, wherein the loss layer is arranged either in an antinode or in a node of a standing wave pattern of the Vertical Cavity Surface Emitting Laser.

9. The Vertical Cavity Surface Emitting Laser according to claim 1, wherein the loss layer comprises a doping which is lower than a doping of the first or second reflectors or is undoped.

10. The Vertical Cavity Surface Emitting Laser according to claim 9, further comprising a current confinement layer, wherein the loss layer is arranged in contact to the current confinement layer or the loss layer is configured as the current confinement layer.

11. The Vertical Cavity Surface Emitting Laser according to claim 10, wherein the loss layer is arranged between the active region and the current confinement layer.

12. The Vertical Cavity Surface Emitting Laser according to claim 1, wherein the loss layer is a hetero-layer formed from at least a first layer with a first refractive index and a second layer with a second refractive index lower than the first refractive index, and a refractive index transition between the first layer and the second layer is step-like.

13. An optical sensor comprising a Vertical Cavity Surface Emitting Laser according to claim 1.

14. A method of fabricating a Vertical Cavity Surface Emitting Laser (VCSEL), the method comprising:

providing an optical resonator; and electrically contacting the optical resonator for providing an electrical drive current to electrically pump the optical resonator, wherein the providing an optical resonator comprises:

providing a first reflector, providing an active region for laser emission, providing a second reflector, wherein the active region is arranged between the first reflector and the second reflector, providing remaining regions outside the active region, and providing a loss layer, wherein the loss layer introduces optical losses at an emission wavelength of the VCSEL and electrical losses, so as to increase wavelength shift of the laser emission when varying the drive current, wherein the optical losses introduced by the loss layer are higher than a sum of optical losses in the remaining regions of the optical resonator, and wherein the electrical losses introduced by the loss layer are higher by a factor of at least 5 than electrical losses in the remaining regions of the optical resonator.

\* \* \* \* \*